(12) United States Patent
Tseng et al.

(10) Patent No.: US 9,768,220 B2
(45) Date of Patent: Sep. 19, 2017

(54) DEEP TRENCH ISOLATION STRUCTURE FOR IMAGE SENSORS

(71) Applicant: Taiwan Semiconductor Manufacturing Co., Ltd., Hsin-Chu (TW)

(72) Inventors: Yuan-Tai Tseng, Zhubei (TW); Yu-Hsing Chang, Taipei (TW); Ming Chyi Liu, Hsinchu (TW); Shih-Chang Liu, Alian Township (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 28 days.

(21) Appl. No.: 14/253,025

(22) Filed: Apr. 15, 2014

(65) Prior Publication Data

US 2015/0295005 A1    Oct. 15, 2015

(51) Int. Cl.
*H01L 27/146*    (2006.01)
*H01L 29/06*    (2006.01)
*H01L 21/762*    (2006.01)

(52) U.S. Cl.
CPC .. *H01L 27/14638* (2013.01); *H01L 21/76232* (2013.01); *H01L 27/1463* (2013.01);
(Continued)

(58) Field of Classification Search
CPC ........... H01L 27/1463; H01L 27/14609; H01L 27/14643; H01L 29/66181; H01L 29/945;
(Continued)

(56) References Cited

U.S. PATENT DOCUMENTS 6,137,152 A * 10/2000 Wu .................... H01L 21/76232
257/506
6,633,028 B2   10/2003 Fowler
(Continued)

OTHER PUBLICATIONS

Aptina Imaging Corporation. "Aptina's Clarity+ Solution—An Aptina Technology White Paper." Published Jul. 2013.
(Continued)

*Primary Examiner* — Shouxiang Hu
(74) *Attorney, Agent, or Firm* — Eschweiler & Potashnik, LLC

(57) ABSTRACT

Some embodiments of the present disclosure relate to a deep trench isolation structure. This deep trench isolation structure is formed on a semiconductor substrate having an upper semiconductor surface. A deep trench, which has a deep trench width as measured between opposing deep trench sidewalls, extends into the semiconductor substrate beneath the upper semiconductor surface. A fill material is formed in the deep trench, and a dielectric liner is disposed on a lower surface and sidewalls of the deep trench to separate the fill material from the semiconductor substrate. A shallow trench region has sidewalls that extend upwardly from the sidewalls of the deep trench to the upper semiconductor surface. The shallow trench region has a shallow trench width that is greater than the deep trench width. A dielectric material fills the shallow trench region and extends over top of the conductive material in the deep trench.

20 Claims, 9 Drawing Sheets

(52) U.S. Cl.
CPC .. *H01L 27/14607* (2013.01); *H01L 27/14616* (2013.01); *H01L 27/14632* (2013.01); *H01L 27/14643* (2013.01); *H01L 27/14654* (2013.01); *H01L 27/14689* (2013.01); *H01L 29/0649* (2013.01)

(58) Field of Classification Search
CPC ............ H01L 29/0649; H01L 27/0921; H01L 27/14632; H01L 27/14654
USPC ....... 257/506, 510, 292, 223, 291, 446, 513, 257/520, 524
See application file for complete search history.

(56) References Cited

U.S. PATENT DOCUMENTS

| | | | |
|---|---|---|---|
| 6,690,080 B2 * | 2/2004 | Norstrom .......... | H01L 21/76232 257/301 |
| 8,088,664 B2 * | 1/2012 | Haussmann ...... | H01L 21/76224 438/294 |
| 8,093,541 B2 | 1/2012 | Chen | |
| 8,405,751 B2 | 3/2013 | Hibbeler et al. | |
| RE45,633 E * | 7/2015 | Mouli | |
| 2005/0176215 A1 * | 8/2005 | Jeong ................... | H01L 21/764 438/427 |
| 2006/0092300 A1 | 5/2006 | Tan et al. | |

OTHER PUBLICATIONS

Axis Communications. "CCD and CMOS Sensor Technology—Technical White Paper." Published in 2010.

* cited by examiner

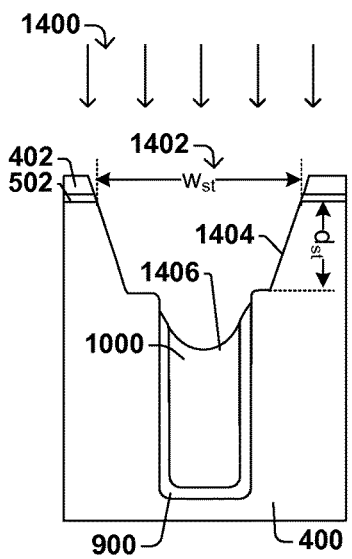 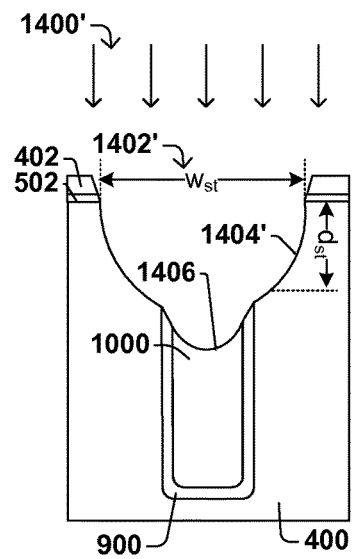 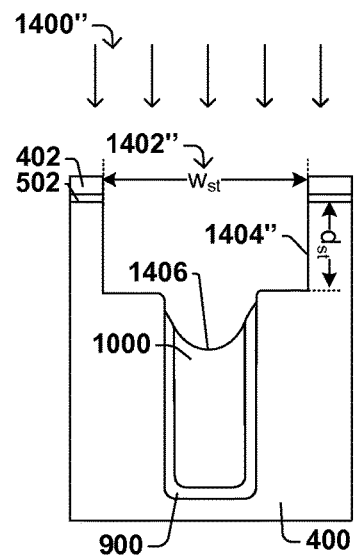
Fig. 14A     Fig. 14B     Fig. 14C
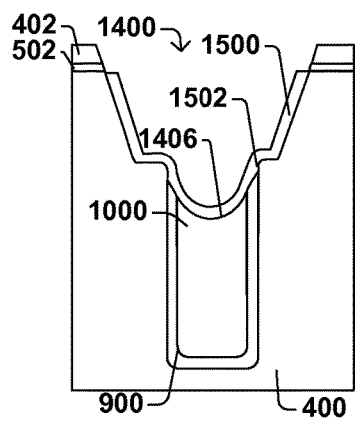
Fig. 15

DEEP TRENCH ISOLATION STRUCTURE FOR IMAGE SENSORS

BACKGROUND

An image sensor converts a visual image to digital data that may be represented as a picture. The image sensor includes an array of pixels, which are unit devices for the conversion of the visual image into digital data. Digital cameras and optical imaging devices employ an image sensor. Image sensors include charge-coupled devices (CCDs) or complementary metal oxide semiconductor (CMOS) sensors. While CMOS image sensors (CIS) devices have been more recently developed compared to CCDs, CIS devices provide an advantage of lower power consumption, smaller size, and faster data processing than CCDs as well as direct digital output that is not available in CCDs. Also, CIS devices have lower manufacturing cost compared with CCDs since many standard semiconductor manufacturing processes may be employed to manufacture CIS devices. For these reasons, commercial employment of CIS devices has been steadily increasing in recent years.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-17 depict a series of cross-sectional views that collectively illustrate a method of forming a deep trench isolation structure in accordance with some embodiments.

DETAILED DESCRIPTION

Figure 1:
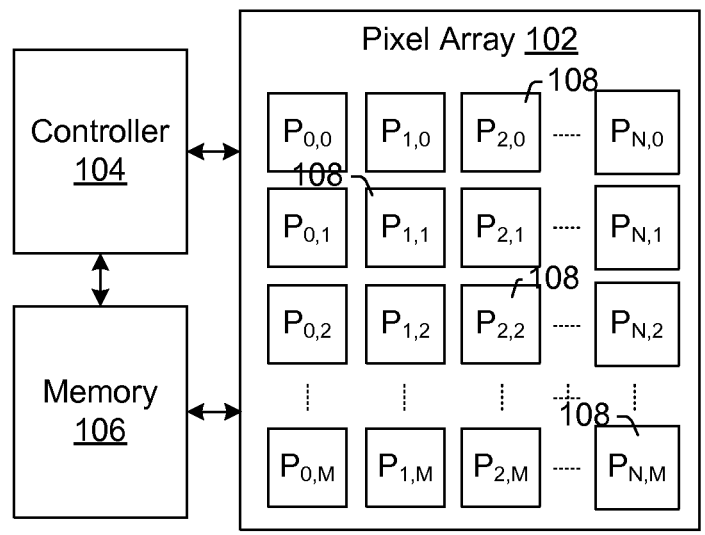
FIG. 1 illustrates a CIS device that includes an array of pixels in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices such as cameras, cellular telephones, personal digital assistants (PDAs), MP3 players, computers and other devices include an image sensor device for capturing images. One example of an image sensor device is a complementary metal-oxide semiconductor (CMOS) image sensor (CIS) device. As shown in FIG. 1, an image sensor device 100 includes a focal plane pixel array 102, a controller 104, and memory 106. The focal plane pixel array 102 typically includes individual pixels 108, which are arranged in a series of N rows and M columns, wherein M and N are positive integers. In FIG. 1's example, the individual pixels 108, which include respective photodiodes therein, have been labeled $P_{row}$, $P_{column}$ for clarity, and it will be appreciated that M and N can be equal or non-equal, depending on the implementation. Because the photodiode within the pixel array 102 are naturally 'color blind', a color filter array (not shown) is typically arranged in front of the pixel array 102 to allow the pixel array 102 to assign color tones to each pixel. A common color registration method is called the 'Bayer RGB (Red, Green, and Blue)' pattern, which has been the standard color filter arrangement in single-sensor color imaging for almost 40 years. Red, green, and blue are the primary colors that, mixed in different combinations, can produce most of the colors visible to the human eye.

During image capture operations, a camera shutter is opened to expose pixels array 102 to light (e.g., an image), and the individual pixels 108 each record light impingent at their respective array locations for some integration time. The image data is then transferred and stored in memory 106, and controller 104 subsequently gathers all the image data, and determines the light intensity recorded at each pixel to reconstruct a digital version of the image. In this way, color images can be digitally stored so device users can share the images on a computer, share them with friends, and the like.

Unfortunately, if conventional pixels are exposed to extremely bright light during operation (and/or if an integration time during which photodiodes collect light/charge is too long), the pixels 108 may be susceptible to a phenomenon known as "blooming." In blooming, the amount of charge generated at a photodiode exceeds the storage capacity of the substrate region of the corresponding pixel. Thus, excess charge can overflow into neighboring pixels. Further, in the past several years, the use of CIS devices has received increased attention in the realm of infrared imaging applications. Infrared light's relatively deep penetration depth in silicon (~10 um for infrared light compared to only ~3 um for visible light) can also increase cross-talk between neighboring pixels. Although deep trench isolation techniques can limit current leakage and dark current somewhat, it has been appreciated that other CIS device techniques result in small, scallop-shaped recesses in the sidewall of CIS deep trench isolation structures. These scallop-shaped recesses, which are usually in the middle to upper portions of vertical deep trench isolations sidewalls, are thought to increase leakage and/or dark current due to localized dopant fluctuations, localized electric-field spiking, and/or localized stress in the region of the scallop-recesses. Therefore, this disclosure provides CIS devices and manufacturing techniques to remove the scalloped recess from the deep trench sidewall to thereby reduce current leakage between neighboring pixels and reduce dark current.

Figure 2:
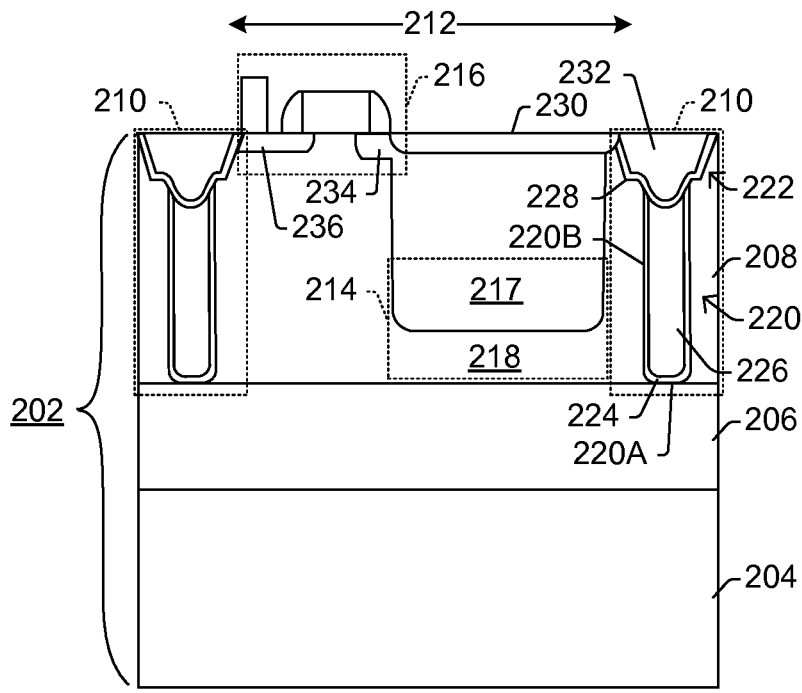
FIG. 2 illustrates a cross-sectional view of a CIS device that is laterally surrounded by a deep trench isolation structure in accordance with some embodiments.

FIG. 2 illustrates a semiconductor image sensor 200, such as can be included in pixel array 102, which is formed on a semiconductor substrate 202 in accordance with some embodiments. In the illustrated example, the substrate 202 is a silicon-on-insulator substrate that includes a handle wafer 204, an insulating layer 206, and a silicon layer 208. A deep trench isolation structure 210 extends into the semiconductor substrate 202 and perimeterally surrounds a region of the silicon layer referred to as an active area 212. In this active area 212, a photo-detecting element 214 and transistor 216 are formed. In some embodiments, the photo detecting element 214 can comprise a photodiode having upper and lower regions 217, 218 that meet at a junction 210 in the silicon layer. In implementations where the upper region 217 is n-type, the lower region 218 is p-type, for example.

To limit current leakage and dark current, the deep trench isolation structure 210 includes a lower, deep trench region 220 and an upper, shallow trench portion 222. The lower deep trench portion 220 includes a dielectric liner 224 formed on a lower surface 220A and sidewalls 220B of the deep trench region 220. This dielectric liner 224 separates a fill material 226 in the deep trench region 220 from the surrounding active area 212, and provides electrical isolation between neighboring pixels. The upper, shallow trench region 222 is wider than the deep trench region and perimeterally surrounds an upper portion of the active area 212. The shallow trench region 222 can have tapered sidewalls 228 that extend upwardly from the deep trench sidewalls 220B to an upper semiconductor substrate surface 230. A dielectric material 232 fills the shallow trench region 222 and extends over top of the conductive material 226 in the deep trench region 220.

The active area 212 can have a lower surface defined by the top of the insulator layer 206. In some embodiments, the deep trench isolation structure 210 vertically extends from the lower surface of the active area 212 to the upper semiconductor substrate surface 230. The transfer transistor 216 has first and second source/drain regions 234, 236 in the active area which are separated from one another by a channel region 238, wherein the first source/drain region 234 is coupled to the photo-detecting element 214. The transfer transistor 216 is configured to selectively pass charge from the photo-detecting element 214 to the second source/drain region 236 based on a whether a gate voltage of greater than a predetermined threshold voltage is applied to a gate electrode of the transfer transistor 216.

As will be appreciated in more detail below, the semiconductor image sensor 200 illustrated in FIG. 2, as well as other described further herein with regards to manufacturing methods, help remove scallop-shaped recesses in the trench sidewalls, thereby providing a lower deep trench portion with substantially vertical, if not truly vertical sidewalls. By removing these scallop-shaped recesses in the trench sidewalls, these structures and techniques help limit current leakage between neighboring pixels and limit dark current compared to other devices.

Figure 3:
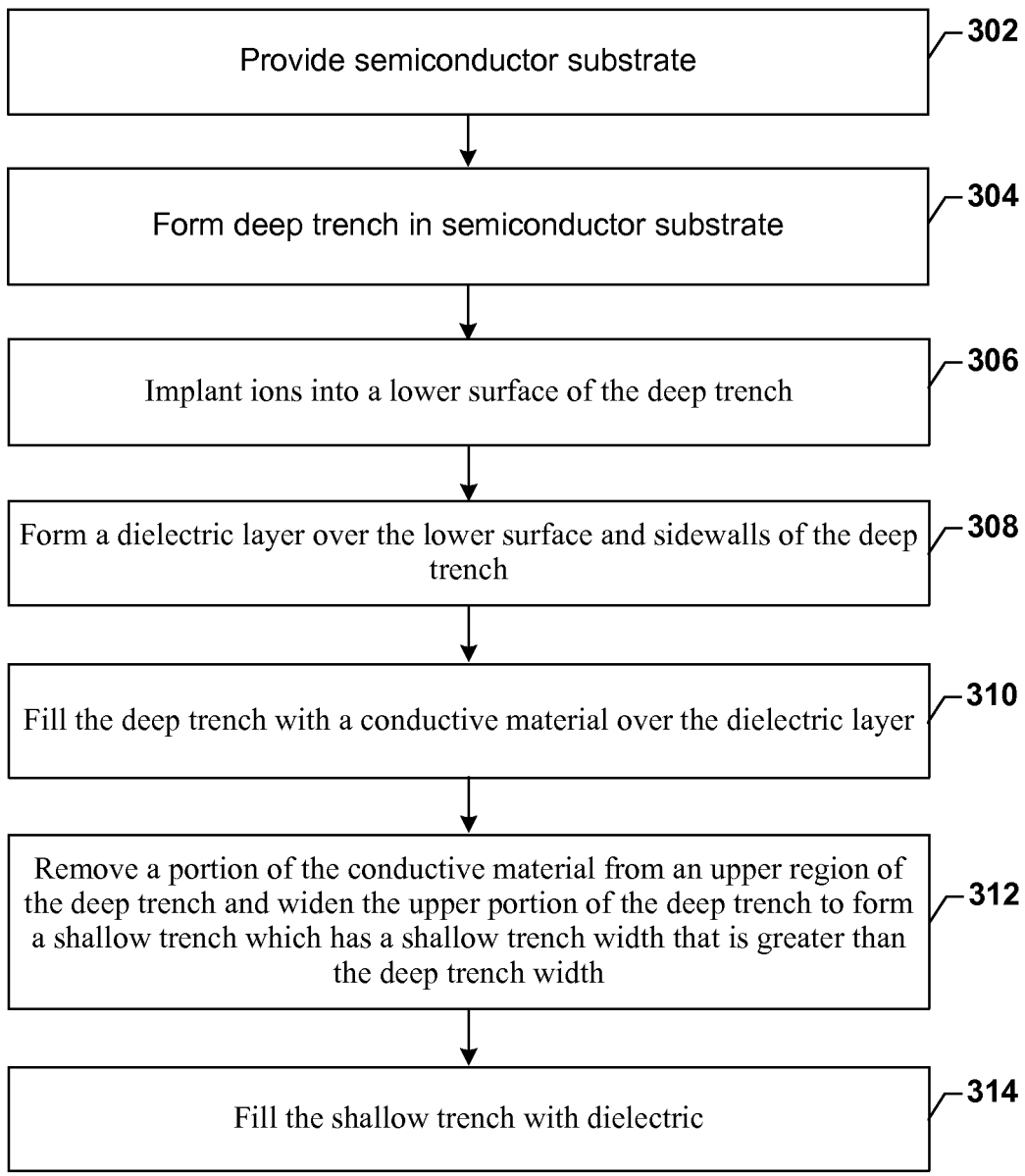
FIG. 3 illustrates a flow chart illustrating a manufacturing method for forming a deep trench isolation structure in accordance with some embodiments.

Turning now to FIG. 3, one can see a manufacturing method in accordance with some embodiments. In this method, a semiconductor substrate is provided at 302. At 304, a deep trench, which has a deep trench width, is formed in the semiconductor substrate. At 306, ions are implanted into a lower surface of the deep trench. At 308, a dielectric layer is formed over the lower surface and sidewalls of the deep trench. At 310, the deep trench is filled with a conductive material over the dielectric layer. In 312, a portion of the conductive material is removed from an upper region of the deep trench and the upper portion of the deep trench is widened to form a shallow trench. This shallow trench has a shallow trench width that is greater than the deep trench width. At 314, the shallow trench is filled with dielectric.

Turning now to FIGS. 4-17, one can see a method of device manufacturing which is illustrated as a series of cross-sectional views. It will be appreciated that not all illustrated steps are necessarily required, and in other embodiments some of these steps may be omitted. Further, in other embodiments, additional process steps which are not illustrated herein may be present. Further still in other embodiments, the order of the illustrated processing steps can be re-arranged. All such embodiments are contemplated as falling with the scope of the present disclosure.

Figure 4:
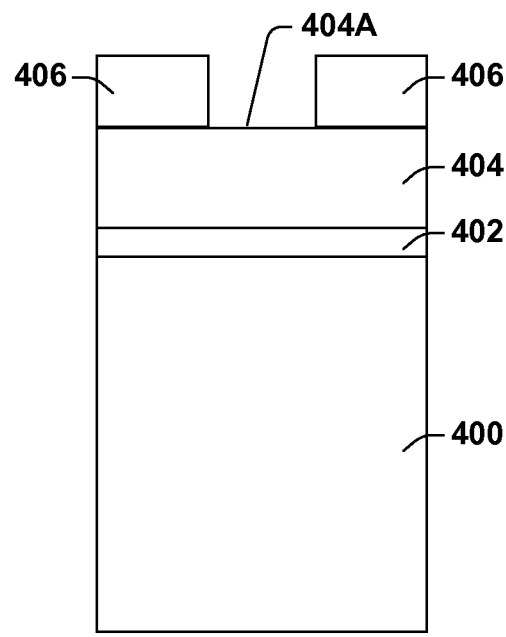

In FIG. 4, a semiconductor substrate 400 is provided. A silicon-nitride (SiN) layer 402 is formed over the substrate 400, and an oxide layer 404 is the deposited or grown of the SiN layer 402. A photoresist layer 406 is then formed, for example spun on, over the SiN layer 402. The photoresist layer 406 is photo-lithographically patterned to expose an upper surface 404A of the SiN layer, while covering some other portions of the upper surface of SiN layer.

In the embodiment illustrated and described below, the semiconductor substrate 400 is referred to as being a silicon substrate. However, the semiconductor substrate 400 in more general terms may be a bulk semiconductor (e.g., silicon) wafer, a binary compound substrate (e.g., a GaAs wafer), a ternary compound substrate (e.g., AlGaAs), or higher order compound wafers, among others. Further, semiconductor substrate 400 can also include non-semiconductor materials such as oxide in silicon-on-insulator (SOI), partial SOI substrate, polysilicon, amorphous silicon, or organic materials, among others. In some embodiments, the semiconductor substrate 400 can also include multiple wafers or dies which are stacked or otherwise adhered together. The semiconductor substrate 400 can include wafers which are cut from a silicon ingot, and/or any other type of semiconductor/non-semiconductor and/or deposited or grown (e.g., epitaxial) layers formed on an underlying substrate.

Figure 5:
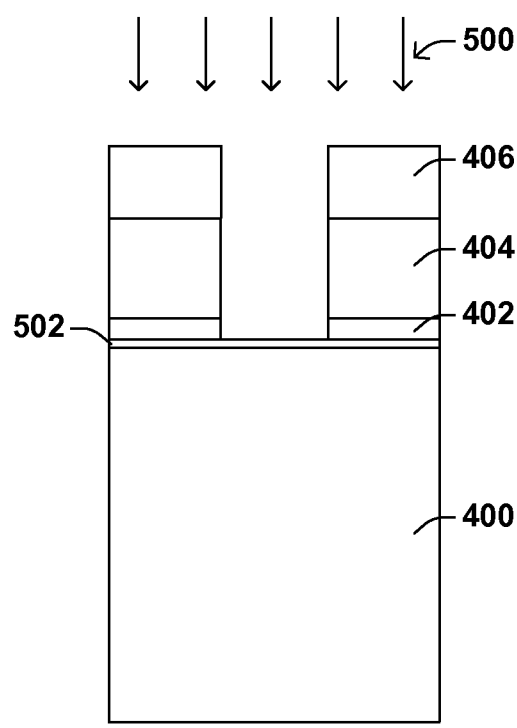

In FIG. 5, an etch 500 is carried out with the patterned photoresist in place to remove the oxide layer 404 and SiN layer 402 under the exposed SiN upper surface 404A. In some embodiments, this etch 500 may stop on an etch stop layer 502 (not shown in previous FIG. 4), which is formed on an upper surface of the substrate 400 and under the SiN layer 402.

Figure 6:
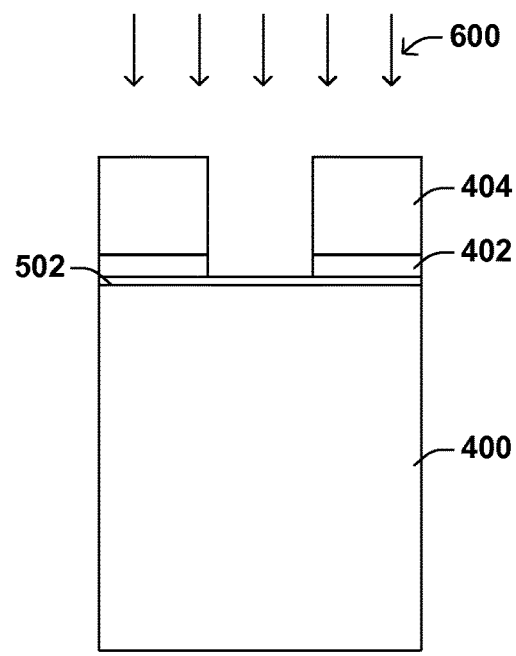

In FIG. 6, a stripping process 600 is used to remove the patterned photoresist.

Figure 7:
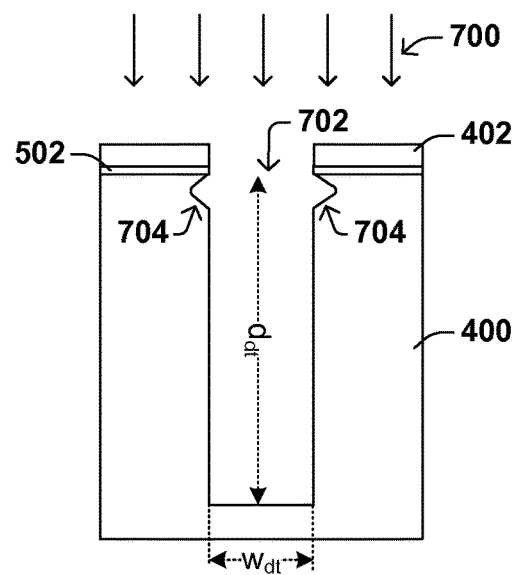

In FIG. 7, with the oxide layer 404 and SiN layer 402 in place to act as a mask, a deep trench etch 700 is carried out to form a deep trench 702 in the substrate 400. In some embodiments, the deep trench 702 can have a deep trench depth, $d_{dt}$, of approximately 3 μm to approximately 12 μm, and a deep trench width, $w_{dt}$, of approximately 0.1 μm to approximately 2 μm. This deep trench etch 700 can also form scallop-shaped recesses 704 in sidewalls of the deep trench 702 beneath the SiN layer 402.

Figure 8:
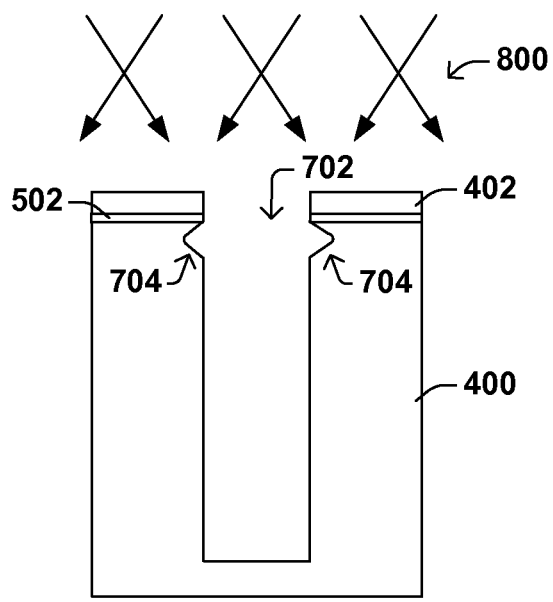

In FIG. 8, while the deep trench 702 is open, an ion implantation 800 is performed. This ion implantation 800 can, for example, form an upper photo-detector device region (e.g., 216 in FIG. 2) which is laterally surrounded by the deep trench. In some embodiments, this ion implantation is an angled implant which is at a non-perpendicular angle of incidence to upper substrate surface. Because of this, ions can be implanted into the lower surfaces of scallop-shaped recesses 704, which might ultimately encourage electric field spiking, parasitic leakage, and dark current issues for the resulting deep trench isolation structure.

Figure 9:
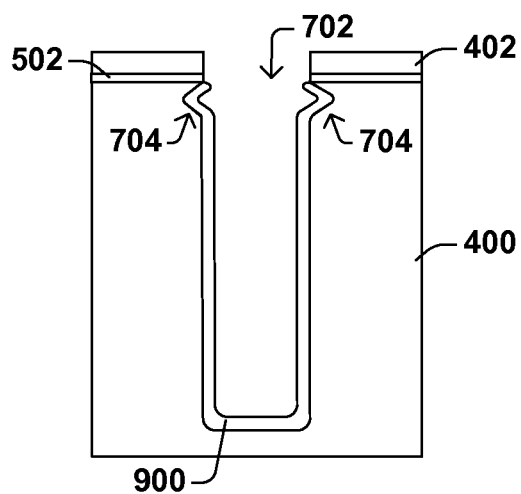

In FIG. 9, a dielectric liner 900 is formed on sidewalls and over a lower surface of the deep trench. In some embodiments, this dielectric liner 900 is an oxide liner, however other dielectric liners are also contemplated as falling with the scope of the present disclosure.

Figure 10:
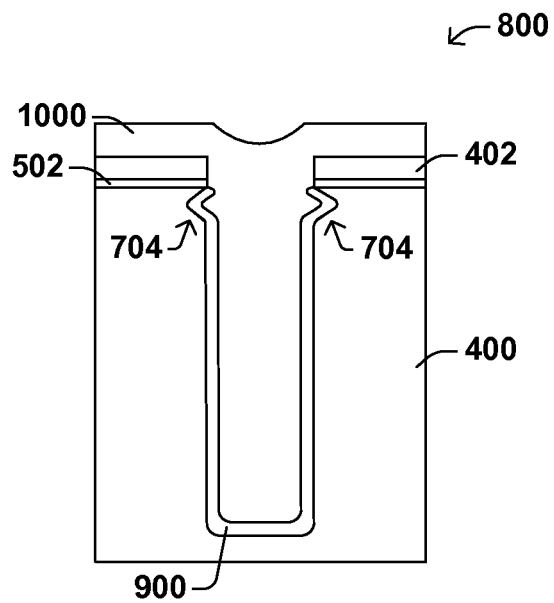

In FIG. 10, a fill material 1000 is formed in the deep trench 702. In some embodiments, the fill material 1000 is polysilicon because it has good fill characteristics, However, although polysilicon has its advantages, other fill materials, such as other conductive materials or insulating materials, could also be used.

Figure 11:
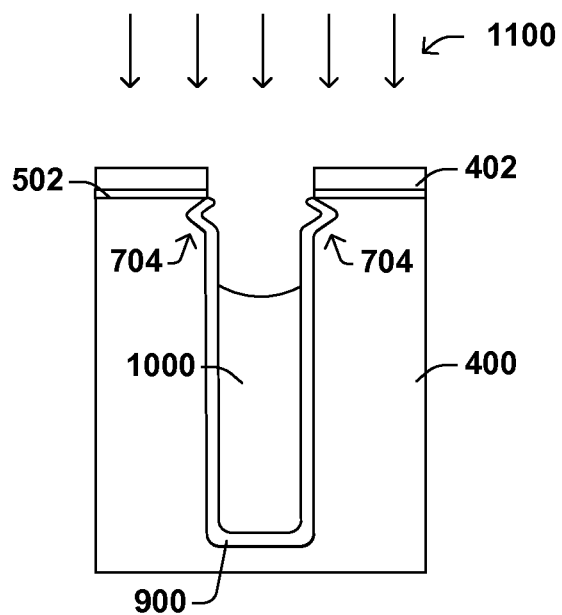

In FIG. 11, an etch 1100 is carried out to etch back the fill material in the deep trench. In typical embodiments, this etch can be carried out for a pre-determined time which is expected to etch below the scallop-shaped recesses by a sufficient amount to allow subsequent removal of the scallop-shaped recesses. For example, in some embodiments, this etch back will remove the fill material from an upper 10% to 50% of the deep trench. For instance, in an example where the deep trench has a deep trench depth of approximately 12 μm, the etch back can remove the fill material from approximately 4.5 μm of the trench.

Figure 12:
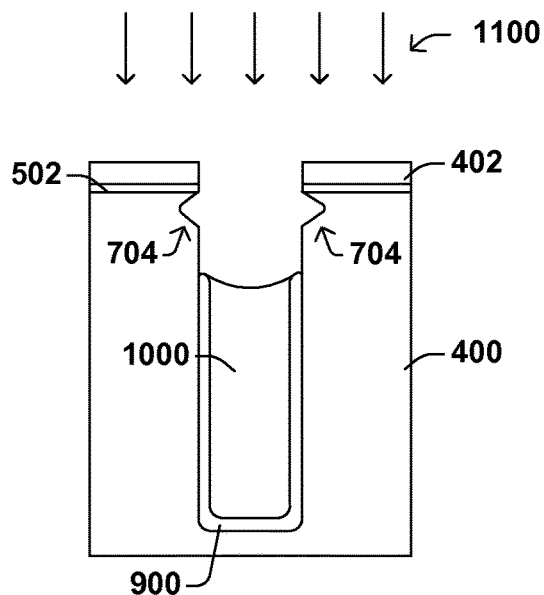

In FIG. 12, an etch 1200 is carried out to remove the liner oxide 900 from an upper portion of the deep trench 702. In some embodiments, this etch 1200 is a wet etch.

Figure 13:
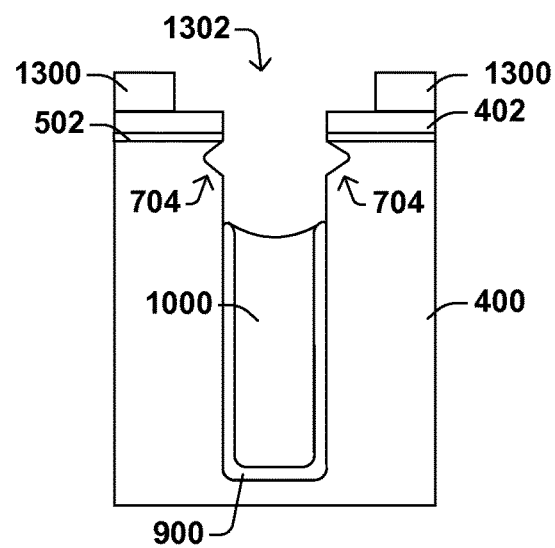

In FIG. 13, a photoresist layer 1300 is formed and photo-lithographically patterned over the SiN layer 402. The patterned photoresist layer 1300 has an opening 1302 with a width that is greater than that of the deep trench 702.

In FIG. 14A, with the patterned photoresist 1300 in place, an etch 1400 is carried out to form a shallow trench 1402 and to remove the scallop-shaped recesses 704. In some embodiments, the shallow trench 1402 can have a shallow trench depth, $d_{st}$, of approximately 0.1 μm to approximately 0.5 μm, while having a shallow trench width, $w_{st}$, of approximately 0.1 μm to approximately 5 μm. In FIG. 14A, the shallow trench 1402 is illustrated with tapered sidewalls 1404. The tapered sidewalls 1404 are separated by a first distance near a lower region of the shallow trench and are separated by a second distance, which is greater than the first distance, near an upper region of the shallow trench. A v-shaped or u-shaped recess 1406 is present over the fill material 1000 in the deep trench.

In FIG. 14B, which is an alternate embodiment after etch 1400' has been carried out, the shallow trench 1402' again has tapered sidewalls 1404'. However, in this embodiment, the tapered sidewalls 1404' are rounded or curved due to the use of etch process 1400'.

In FIG. 14C, which is another alternate embodiment after etch 1400" has been carried out, the shallow trench 1402" has substantially vertical sidewalls 1404".

In FIG. 15, a dielectric liner 1500, which can be made of a first dielectric material such as oxide, is formed on the sidewalls of the shallow trench. Notably, due to the etch and fill procedures, an upper surface of the fill material in the deep trench often meets a corresponding lower surface of the dielectric liner at a v-shaped or u-shaped interface 1406. Further, in some instances, a shoulder 1502 is present in the semiconductor substrate where a tapered sidewall or vertical sidewall meets the v-shaped or u-shaped interface 1406.

Figure 16:
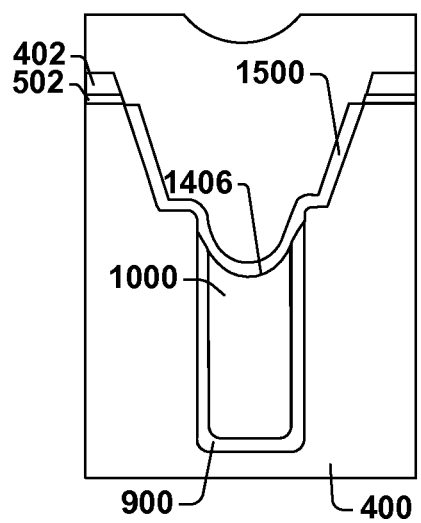

In FIG. 16, the remaining shallow trench region 1400 can be filled with a second dielectric material 1600. In some embodiments, the first dielectric material used for the dielectric liner 1500 has a first density, while the second dielectric material 1600 has a second density that is greater than the first density. For example, the second dielectric material can be formed by a high density plasma (HDP) process to provide good electrical shallow trench isolation. The HDP can be reliable here given the shallow trench can have a relative low aspect ratio.

Figure 17:
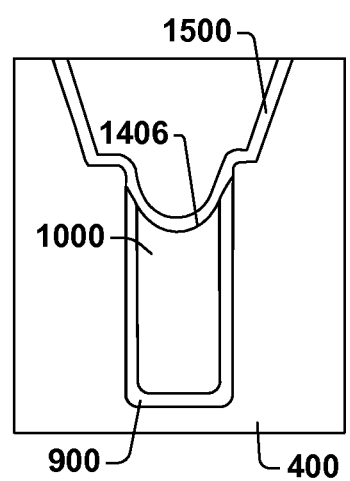

In FIG. 17, chemical mechanical polishing (CMP) is carried out to planarize an upper surface of the structure, and the SiN layer is removed, for example by a wet etch.

Some embodiments of the present disclosure relate to a deep trench isolation structure. This deep trench isolation structure is formed on a semiconductor substrate having an upper semiconductor surface. A deep trench, which has a deep trench width as measured between opposing deep trench sidewalls, extends into the semiconductor substrate beneath the upper semiconductor surface. A fill material is formed in the deep trench, and a dielectric liner is disposed on a lower surface and sidewalls of the deep trench to separate the fill material from the semiconductor substrate. A shallow trench region has sidewalls that extend upwardly from the sidewalls of the deep trench to the upper semiconductor surface. The shallow trench region has a shallow trench width that is greater than the deep trench width. A dielectric material fills the shallow trench region and extends over top of the conductive material in the deep trench.

Other embodiments relate to a semiconductor image sensor which is formed on a semiconductor substrate including an active area. A photo-detecting region is disposed in the active area of the semiconductor substrate. A deep trench extends into the semiconductor substrate and perimeterally surrounds a lower portion of the active area. A conductive material is disposed in the deep trench. A dielectric liner is formed on a lower surface and sidewalls of the deep trench region to separate the conductive material in the deep trench from the semiconductor substrate. A shallow trench region extends into the semiconductor substrate and perimeterally surrounds an upper portion of the active area. The shallow trench region has sidewalls that extend upwardly from the sidewalls of the deep trench region to an upper surface of the semiconductor substrate. A dielectric material fills the shallow trench and extends over top of the conductive material in the deep trench.

Still other embodiments relate to a method. In this method, a semiconductor substrate is provided. A deep trench having a deep trench width is formed in the semiconductor substrate. A dielectric liner is formed over the lower surface and sidewalls of the deep trench. The deep trench is filled with a fill material over the dielectric liner. A portion of the fill material is removed from an upper region of the deep trench, and the upper portion of the deep trench is widened to form a shallow trench. The shallow trench has a shallow trench width that is greater than the deep trench width. The shallow trench is filled with dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deep trench isolation structure in a semiconductor image sensor, comprising:
   a semiconductor substrate including an active area and having an uppermost semiconductor surface;
   a photo-detecting region in the active area of the semiconductor substrate;
   a deep trench, which has a deep trench width as measured between opposing deep trench sidewalls, extending into the semiconductor substrate beneath the uppermost semiconductor surface, wherein half the deep trench width is defined by a virtual straight centerplane, and wherein the deep trench sidewalls are symmetric about the virtual straight centerplane;
   a conductive fill material in the deep trench;
   a first dielectric liner disposed on a lower surface of the deep trench and along the deep trench sidewalls to separate the fill material from the semiconductor substrate;
   a shallow trench region having shallow trench sidewalls that extend upwardly from the deep trench sidewalls to the uppermost semiconductor surface, wherein the shallow trench region has a shallow trench width that is greater than the deep trench width, wherein half the shallow trench width is also defined by the virtual straight centerplane, and wherein the shallow trench sidewalls are symmetric about the virtual straight centerplane; and
   a dielectric material filling the shallow trench region and extending over top of the fill material in the deep trench; and
   a second dielectric liner disposed on the sidewalls of the shallow trench and over the deep trench to separate the fill material in the deep trench from the dielectric material filling the shallow trench, wherein a lower surface of the second dielectric liner contacts an uppermost surface of the first dielectric liner at an interface that is below an uppermost surface of the deep trench sidewalls.

2. The deep trench isolation structure of claim 1, wherein the shallow trench sidewalls are separated by a first distance near a lower region of the shallow trench region and are separated by a second distance, which is greater than the first distance, near an upper region of the shallow trench region, and wherein the shallow trench sidewalls extend linearly in a v-shape or transition incrementally and continuously in a curvilinear shape from the lower to the upper region of the shallow trench region.

3. The deep trench isolation structure of claim 1, wherein the dielectric material filling the shallow trench region comprises:
   the second dielectric liner, which has a first density, lining the shallow trench sidewalls of the shallow trench region and extending overtop an upper surface of the conductive fill material in the deep trench; and
   the dielectric material, which has a second density that is greater than the first density, filling a remainder of the shallow trench region.

4. The deep trench isolation structure of claim 1, wherein the first dielectric liner and the dielectric material comprise an oxide, and wherein the conductive fill material comprises polysilicon.

5. The deep trench isolation structure of claim 1, wherein an upper surface of the conductive fill material in the deep trench meets a corresponding lower surface of the second dielectric liner at a v-shaped or u-shaped interface.

6. The deep trench isolation structure of claim 5, wherein a shoulder is present in the semiconductor substrate where a shallow trench sidewall meets the v-shaped or u-shaped interface.

7. The deep trench isolation structure of claim 5, wherein the lower surface of the deep trench is approximately 3 μm to approximately 12 μm below the uppermost semiconductor surface.

8. The deep trench isolation structure of claim 1, wherein the semiconductor substrate comprises a silicon layer, and wherein the second dielectric liner is in direct contact with the silicon layer.

9. A semiconductor image sensor comprising:
   a semiconductor substrate including an active area and an uppermost semiconductor surface;
   a photo-detecting region in the active area of the semiconductor substrate;
   a deep trench, which has a deep trench width as measured between opposing deep trench sidewalls, extending into the semiconductor substrate and perimeterally surrounding a lower portion of the active area, wherein half the deep trench width is defined by a virtual straight centerplane, and wherein the deep trench sidewalls are symmetric about the virtual straight centerplane;
   a conductive material in the deep trench;
   a first dielectric liner formed on a lower surface and sidewalls of the lower portion of the deep trench to separate the conductive material in the deep trench from the semiconductor substrate;
   a shallow trench, which has a shallow trench width as measured between opposing shallow trench sidewalls, extending into the semiconductor substrate and perimeterally surrounding an upper portion of the active area, wherein the shallow trench has sidewalls that extend upwardly from the sidewalls of the deep trench to the uppermost semiconductor surface, wherein half the shallow trench width is defined by the virtual straight centerplane, and wherein the shallow trench sidewalls are symmetric about the virtual straight centerplane; and
   a dielectric material filling the shallow trench and extending over top of the conductive material in the deep trench; and
   a second dielectric liner disposed on the sidewalls of the shallow trench, wherein the second dielectric liner extends continuously in a v-shaped or a u-shaped contour downwardly into the deep trench and spans the deep trench width, and wherein the second dielectric liner contacts an uppermost surface of the first dielectric liner at an interface that is below an uppermost surface of the deep trench sidewalls.

10. The semiconductor image sensor of claim 9, wherein the active area has a lower surface defined by a buried oxide layer and wherein the deep trench and shallow trench collectively vertically extend from the lower surface of the active area to the uppermost surface of the semiconductor substrate.

11. The semiconductor image sensor of claim 9, further comprising:
   a transfer transistor having first and second source/drain regions in the active area which are separated from one another by a channel region, wherein the first source/drain region is coupled to the photo-detecting region.

12. The semiconductor image sensor of claim 11, wherein the transfer transistor is configured to selectively pass charge from the photo-detecting region to the second source/drain region based on a whether a gate voltage of greater than a predetermined threshold voltage is applied to a gate electrode of the transfer transistor.

13. The semiconductor image sensor of claim 9, wherein an upper surface of the conductive material in the deep trench meets a corresponding lower surface of the second dielectric liner at a v-shaped or u-shaped interface.

14. An integrated circuit having a semiconductor image sensor, comprising:
a semiconductor substrate including an active area and having an uppermost semiconductor surface;
a photo-detecting region in the active area of the semiconductor substrate;
a shallow trench region having shallow trench sidewalls which extend downwardly at an angle from the uppermost semiconductor surface into the semiconductor substrate to a lowermost portion of the shallow trench region, and which are spaced apart by a shallow trench width, wherein half the shallow trench width is defined by a virtual straight centerplane, and wherein the shallow trench sidewalls are symmetric about the virtual straight centerplane;
a deep trench region having deep trench sidewalls which extend downwardly from the lowermost portion of the shallow trench region into the semiconductor substrate and which are spaced apart by a deep trench width which is less than the shallow trench width, wherein half the deep trench width is defined by the virtual straight centerplane, and wherein the deep trench sidewalls are symmetric about the virtual straight centerplane;
a conductive fill material disposed in the deep trench region;
a first dielectric liner disposed on a lower surface and deep trench sidewalls of the deep trench to separate the fill material from the semiconductor substrate, wherein the first dielectric liner has uppermost horizontal surfaces; and
a dielectric material filling the shallow trench region and extending over top of the fill material in the deep trench region; and
a second dielectric liner disposed on the sidewalls of the shallow trench, wherein the second dielectric liner comprises a continuous extension in a downward direction into the deep trench region that extends below the uppermost horizontal surfaces of the first dielectric liner and that spans the deep trench width with a contour that is symmetric about the virtual straight centerplane, and wherein an outer edge of the second dielectric liner that is within the deep trench region aligns with and meets an outer edge of the first dielectric liner.

15. The integrated circuit of claim 14, wherein the shallow trench sidewalls are separated by a first distance near the lowermost portion of the shallow trench region and are separated by a second distance near an upper region of the shallow trench region closest to the upper semiconductor surface, the second distance being greater than the first distance, and wherein the shallow trench sidewalls extend linearly in a v-shape or transition incrementally and continuously in a curvilinear shape from the lower to the upper region of the shallow trench region.

16. The integrated circuit of claim 14, wherein the dielectric material filling the shallow trench region comprises:
the second dielectric liner, which has a first density, lining the sidewalls of the shallow trench region and extending overtop an upper surface of the conductive fill material in the deep trench region; and
the dielectric material, which has a second density that is greater than the first density, filling a remainder of the shallow trench region.

17. The integrated circuit of claim 14, wherein the first dielectric liner and the dielectric material comprise an oxide, and wherein the conductive fill material comprises polysilicon.

18. The integrated circuit of claim 14, wherein an upper surface of the conductive fill material in the deep trench meets a corresponding lower surface of the second dielectric liner at a v-shaped or u-shaped interface.

19. The integrated circuit of claim 14, wherein the shallow trench region and deep trench region trace out an overlapping perimeter that fully surrounds the active area in the semiconductor substrate.

20. The integrated circuit of claim 19, wherein the active area has a lower surface corresponding to an upper surface of a buried oxide layer and wherein the deep trench and shallow trench collectively vertically extend from the lower surface of the active area to the upper surface of the semiconductor substrate.

* * * * *